(12) United States Patent
Devoe et al.

(10) Patent No.: US 8,289,675 B2
(45) Date of Patent: Oct. 16, 2012

(54) STACKED MULTILAYER CAPACITOR

(76) Inventors: Daniel Devoe, San Diego, CA (US);
Alan Devoe, La Jolla, CA (US);
Lambert Devoe, San Diego, CA (US)

( * ) Notice: Subject to any disclaimer, the term of this patent is extended or adjusted under 35 U.S.C. 154(b) by 238 days.

(21) Appl. No.: 12/616,533

(22) Filed: Nov. 11, 2009

(65) Prior Publication Data

US 2010/0053842 A1   Mar. 4, 2010

Related U.S. Application Data

(63) Continuation-in-part of application No. 12/245,926, filed on Oct. 6, 2008, now Pat. No. 7,633,739, which is a continuation-in-part of application No. 11/753,090, filed on May 24, 2007, now abandoned.

(51) Int. Cl.
*H01G 4/228* (2006.01)
(52) U.S. Cl. .............. 361/306.3; 361/306.1; 361/308.1
(58) Field of Classification Search .............. 361/306.3
See application file for complete search history.

(56) References Cited

U.S. PATENT DOCUMENTS

| | | | |
|---|---|---|---|
| 3,962,713 A | 6/1976 | Kendall et al. |
| 3,969,197 A | 7/1976 | Tolar et al. |
| 4,017,885 A | 4/1977 | Kendall et al. |
| 4,114,120 A | 9/1978 | Lupfer |
| 4,123,730 A | 10/1978 | Fikart |
| 4,158,218 A | 6/1979 | McLaurin et al. |
| 4,584,627 A | 4/1986 | Schilling et al. |
| 5,659,455 A | 8/1997 | Herbert |
| 6,081,416 A | 6/2000 | Trinh et al. |
| 6,310,764 B1 | 10/2001 | Will et al. |
| 6,620,753 B2 | 9/2003 | Nakamura et al. |
| 6,924,967 B1 | 8/2005 | Devoe |
| 6,944,009 B2 | 9/2005 | Nguyen et al. |
| 6,985,366 B2 | 1/2006 | Albayrak et al. |

(Continued)

FOREIGN PATENT DOCUMENTS

EP   1220246 A1   7/2002
(Continued)

OTHER PUBLICATIONS

Office Action issued in related U.S. Appl. No. 11/753,090; dated as mailed on Dec. 10, 2008; 18 pages; USPTO.

(Continued)

*Primary Examiner* — Jayprakash N Gandhi
*Assistant Examiner* — Dion Ferguson
(74) *Attorney, Agent, or Firm* — Wood, Herron & Evans, LLP

(57) ABSTRACT

A capacitor device mountable on a plane of a substrate includes an electrically conductive bottom plate adapted to be mounted substantially parallel to, and in electrical contact at the plane of the substrate and a first multilayer capacitor having substantially parallel first and second electrode plates oriented substantially perpendicular to the bottom plate with the first electrode plates being electrically connected to the bottom plate. An electrically conductive top lead frame overlaps with, and is electrically isolated from, the bottom plate. The top lead frame electrically connected to the second electrode plates and adapted to be electrically connected at the plane of the substrate. The bottom lead frame may have a corrugated shape, where the corrugated shape provides compliance between the first multilayer capacitor and the substrate. A portion of the top lead frame may contact at least a portion of a side of the first multilayer capacitor.

22 Claims, 15 Drawing Sheets

U.S. PATENT DOCUMENTS

| | | |
|---|---|---|
| 7,151,661 B2 | 12/2006 | Kimura et al. |
| 7,365,957 B2 * | 4/2008 | Togashi et al. ............. 361/306.3 |
| 2001/0001258 A1 | 5/2001 | Ishigaki et al. |
| 2001/0007522 A1 | 7/2001 | Nakagawa et al. |
| 2005/0230030 A1 | 10/2005 | Prymak |
| 2007/0188975 A1 | 8/2007 | Togashi et al. |

FOREIGN PATENT DOCUMENTS

| | | | |
|---|---|---|---|
| EP | 1480236 | A2 | 11/2004 |
| GB | 2447321 | A1 | 10/2008 |
| JP | 2000232030 | A | 8/2000 |
| WO | 2004010756 | A2 | 1/2004 |

OTHER PUBLICATIONS

International Search Report, PCT/US2008/081096, Mar. 23, 2009, 4 pages, European Patent Office.

* cited by examiner

US 8,289,675 B2

STACKED MULTILAYER CAPACITOR

CROSS-REFERENCE TO RELATED APPLICATIONS

This application is a continuation-in-part of U.S. application Ser. No. 12/245,926, entitled "STACKED MULTILAYER CAPACITOR," filed Oct. 6, 2008, which is a continuation in part of U.S. application Ser. No. 11/753,090, entitled "STACKED MULTILAYER CAPACITOR," filed May 24, 2007, the entireties of which are incorporated by reference herein.

FIELD OF THE INVENTION

The present invention relates generally to stacked ceramic capacitors and more specifically, to mounting a stacked ceramic capacitor to a substrate.

BACKGROUND OF THE INVENTION

Multilayer ceramic chips 22 (FIG. 1) are common capacitors used for bypass, coupling, or energy storage applications in electronic circuits. The chips 22 include internal parallel plates 26 in dielectric body 28 such as a ceramic. The parallel plates are connected by terminations 24, 25 on the outer edges of the chip 22. End terminations 24, 25 electrically connect each of the respective internal electrode plates 26 and provide an external electrical connection to the multilayer capacitor. Common sizes of the chips may range from 0201 (0.02"× 0.01") to 1206 (0.12"×0.06"). Larger sized chips may give higher capacitance at any given voltage rating. In some cases, there may be a need for much larger multilayer ceramic capacitors, ranging in size from 0.25"×0.25", up to 1.2"×1.2" in area. Usually in these larger sizes, it is desirable to use multiple chips together. These chips 22 are often stacked one on top of another as illustrated in FIGS. 2A and 2B, then soldered 29 together with leads or are soldered to a lead frame 26. With this technique, it is possible to make large capacitance values (1 µF to 180 µF) at moderate voltages (50 V to 500V).

Stacked capacitors 20 may be used in different power supply designs including: (1) resonant power supplies, operating at 1 MHz to 60 MHz, with a high power AC sine wave applied to the capacitors; (2) direct filtering across three phases of an AC supply operating at low frequency (60-800 Hz) at moderate voltages (48-480 volts); and (3) DC-DC converters, on the input or output side of the supply, where the capacitors see a moderate DC voltage plus an AC ripple that comes off of a switching transistor (at 100 k kHz to 500 kHz and 0.1 to 3 amps current). The stacked capacitors may carry high power due to high ripple current from switching transistors.

Circuit designers who use stacked capacitors 20 for these applications are concerned first with the capacitance and voltage rating that will make the circuit function. There is also a concern with second order effects such as the effects of heat dissipation affecting thermal expansion or contraction and vibration from mechanical shock. Heat dissipation is primarily achieved by conduction. It is generally accepted that air convection accounts for only a small portion of the heat dissipated from the chip 22. Conduction occurs through an internal electrode to the silver end terminations 24 through the solder 29 to the lead frames 26 and then into a circuit board 30 or other substrate. In the case of the stacked capacitor 20, the heat conduction has a longer path due to the height of the stack. Heat conduction from the top of the stack down to the circuit board 30 may be very inefficient.

Generally speaking, since a significant amount of heat is generated in the vicinity of a source, substrates are normally constituted with aluminum having a high heat discharge capacity. However, since the temperature in the vicinity of the source changes greatly when the source is turned on and off, a significant amount of thermal stress occurs at a ceramic capacitor mounted on the aluminum substrate, which has a high coefficient of thermal expansion. This thermal stress may cause cracking to occur at the ceramic capacitor, which, in turn, may induce problems such as shorting defects and arcing.

Further concerns about the performance of stacked capacitors arise under vibration and mechanical shock conditions. The stacks may be tall and heavy. Under normal design conditions, the height may reach 0.72 inches in some stacked configurations, with areas ranging from 0.25"×0.25" up to 1.2"×2.0". When used in a satellite or rocket, there is a legitimate concern of the part falling off of the circuit board, or at least of the solder joints cracking or breaking loose resulting from excessive vibrations and extreme environmental conditions. Many designers resort to using an epoxy to help adhere the capacitor to the board, but this is not optimal because the epoxy itself might cause problems, such as thermal stresses, under certain temperature conditions due to the expansion or contraction of the epoxy.

An additional concern is that the inductance of the capacitors in a power application may have a large impact on the performance of the chip. Lower inductance is always a good property in a ceramic capacitor. One common method of achieving lower inductance is to rotate the aspect ratio of the chip as can be seen in FIG. 2C. A traditional 1206 chip 22 (0.12"×0.06"), FIG. 1B, can have half the inductance if the dimensions of the chip 22 are changed to 0612 (0.06"×0.12") as shown on chip 32, FIG. 2C. Literature claims that the change from 1206 to 0612 will reduce the inductance from 1200 pH to 170 pH.

Beam lead capacitors, such as the beam lead capacitor 40 of FIG. 3A and FIG. 3B, are typically composed of a single layer parallel plate capacitor 40 with the parallel plates 42 on either side of a dielectric 44 parallel to a circuit board 46 (FIG. 3C). Two silver foil leads 48, 50 electrically connect the capacitor to the circuit board 46. The bottom lead 48 is traditionally soldered to the circuit board 46 and the top lead 50 solders down to a different location on the board 46. One key aspect of the beam lead capacitor 40 is that the configuration of the capacitor was not intended to be soldered at the chip itself. Rather, the ribbon leads 48, 50 specifically exist to allow the part to be soldered away from the capacitor. This is done to either avoid thermal shock, or to allow connection to some other location away from the capacitor as seen, for example in FIG. 3C and FIG. 3D. The width of the top "beam" lead 50 may be the same width as a conductor on the circuit board 46. Because the beam lead arrangement does not contain interior plates, it does not benefit from the advantages of multilayer capacitors.

What is needed in the art, therefore, is a stacked multilayer capacitor that does not have the disadvantages described above.

SUMMARY OF THE INVENTION

The present invention provides a stacked multilayer capacitor that substantially improves heat transfer from the capacitor, is tolerant of thermal stresses caused by expansion and contraction, is resistant to vibration and mechanical shock conditions and has a low inductance. The stacked multilayer capacitor has a split lead frame that provides larger areas in electrical contact with the capacitor and a substrate to substantially improve heat transfer from the capacitor and provide an improved tolerance to thermal stresses resulting from expansion and contraction. Further, the split lead frame may optionally be used to attach the stacked multilayer capacitor to the substrate with fasteners, thereby making it more tolerant to vibration and mechanical shock. In addition, the split lead frame facilitates mounting the stacked multilayer capacitor on the substrate in an orientation that reduces inductance.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the present invention address the problems in the prior art by providing stacked multilayer capacitors with improved vibration, inductance and thermal characteristics as well as improved single multilayer capacitors. The multilayer capacitors may be of the type illustrated in FIG. 1.

Figure 4:
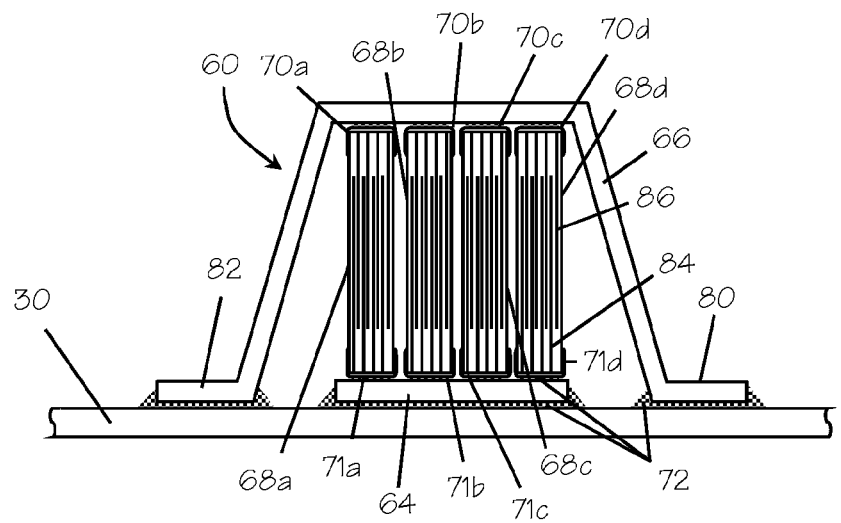
FIG. 4 illustrates a front view of a stacked multilayer capacitor consistent with an exemplary embodiment of the invention.
Figure 5:
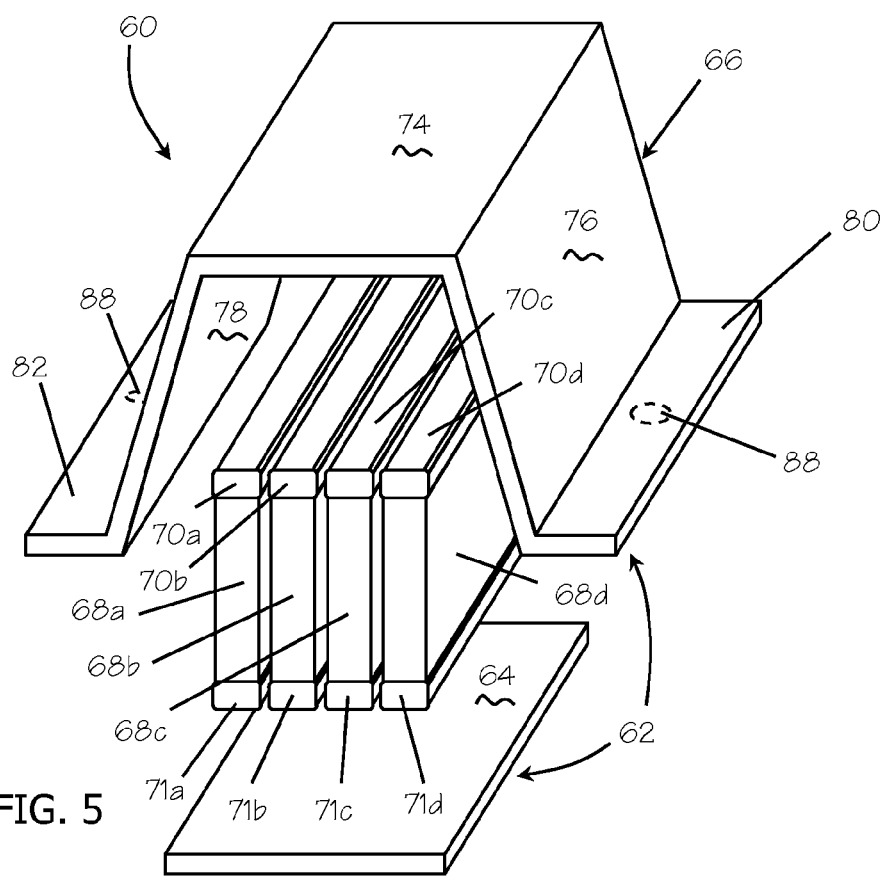
FIG. 5 is an exploded view of the components of the stacked multilayer capacitor in FIG. 4.

Turning now to the remaining drawings, wherein like numbers denote like parts throughout the several views, FIGS. 4 and 5 illustrate an exemplary embodiment of the stacked multilayer capacitor. The stacked multilayer capacitor 60 is composed of a split lead frame 62 having a bottom lead frame 64 containing a bottom plate and a top lead frame 66. The lead frame 62 electrically connects one or more multilayer capacitors 68a-68d having respective conductive end terminations 70a-70d, 71a-71d. The multilayer capacitors 68a-68d may be capacitors similar to capacitor 22 or 32 known in the art and discussed above (FIGS. 1, 2B, and 2C). As discussed above, the aspect ratios of the multilayer capacitors may be rotated to achieve a lower inductance in each of the multilayer capacitors 68a-68d in the stack. For embodiments of the capacitor where vibration rather than inductance or heat reduction is the design variable, then the length of the capacitors from termination to termination may be equal to the width of the capacitor, or the length from termination to termination may be longer than the width of the capacitor. For example, a chip size of 0.4"×0.4" in area and 0.125" thick, with about four chips standing on end may make up the stacked capacitor.

The split lead frame 62 may be composed of materials made out of various types of conductive material, for example, copper, alloy 42, kovar or other conductive metals or materials. Any combination of alloy may be chosen for optimal properties when looking at thermal conductivity, electrical conductivity, and the coefficient of thermal expansion. The materials for the top 66 and bottom 64 lead frames may be different. For example, copper may be chosen for the top lead frame 66 for electrical conductivity but alloy 42 may be chosen for the bottom lead frame 64, because it has reasonable conductivity but very low thermal expansion which may help match the expansion between a circuit board 30 or other substrate and the stacked multilayer capacitor 60. In some of the embodiments solder 72 is used to connect the parts of the stacked multilayer capacitor 60 as well as to connect the capacitor 60 to the circuit board 30. The solder may be a high temperature solder such as 10Sn/88Pb/2Ag. Alternately, some other solder or a conductive epoxy could be used. For example, if the top lead frame is composed of silver and the termination on the capacitor is also composed of silver, the top lead frame may then be joined to the termination with a silver paste that may contain silver powder and glass frit.

FIG. 5 shows an exploded view of the components of the multilayer capacitor 60. The bottom lead frame 64 is electrically connected to the end terminations 71a-71d of a plurality of multilayer capacitors 68a-68d. By orienting the multilayer capacitors substantially in the vertical direction, and making the capacitors short in vertical height, the stack is of inherently low inductance and presents a lower profile against the circuit board. The top plate 74 of the top lead frame 66 is designed to electrically contact the terminations 70a-70d on the opposite ends of the multilayered capacitors 68a-68d. The opposed edges of the top plate 74 connect to transition portions 76, 78, which extend down toward the circuit board 30 and connect to respective flange portions 80, 82 of the top lead frame 66. This orientation of the stacked multilayer capacitor 60 may result in better electrical performance.

As best seen in FIG. 4, the multilayer capacitors 68a-68d may be positioned such that the interior electrodes 84, 86 are oriented substantially nonparallel with the circuit board 30. Embodiments of the stacked capacitor 40 having multilayer capacitors 68a-68d with interior electrodes 84, 86 oriented substantially normal to the circuit board 30 may provide a smaller footprint on the circuit board 30. Solder areas 72 electrically connect the plurality of multilayer capacitors 68a-68d through the end terminations 70a-70d, 71a-71d to the top lead frame 66 and the bottom lead frame 64 respectively. The top 66 and bottom 64 lead frames may also be soldered 72 to a circuit board 30 to provide electrical connections between the circuit board 30 and the stacked capacitor 60.

Figure 1:
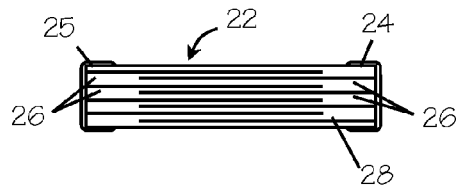
FIG. 1 illustrates the internal electrodes of an exemplary known multilayer capacitor.
Figure 2A:
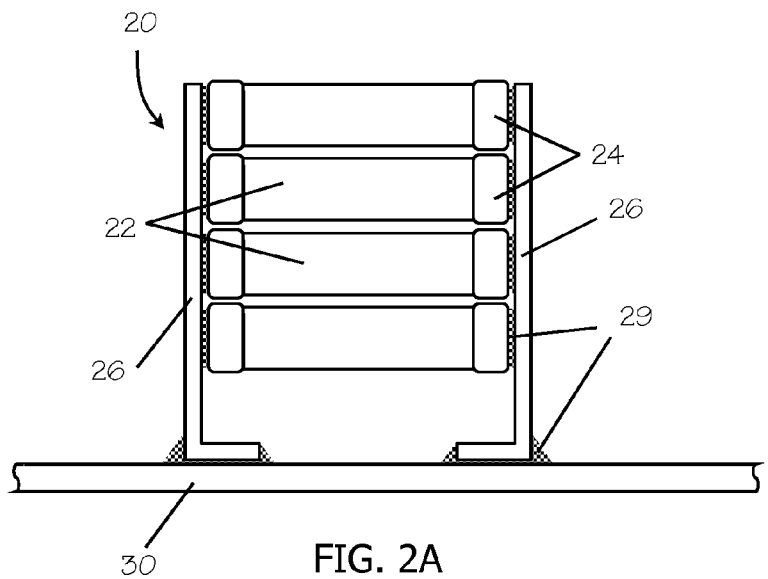
FIG. 2A illustrates a known configuration for a stacked multilayer capacitor.
Figure 2B:
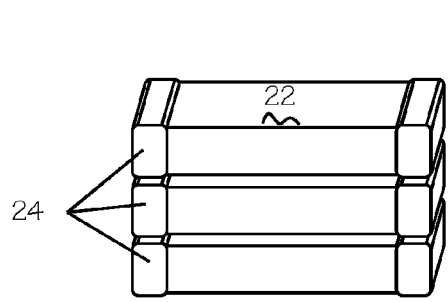
FIG. 2B illustrates a stack of known multilayer capacitors, such as in FIG. 1A.
Figure 2C:
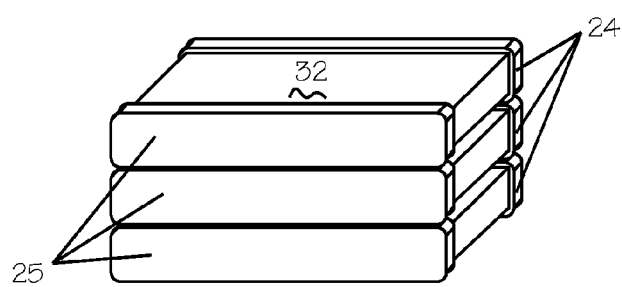
FIG. 2C illustrates the stack of multilayer capacitors in FIG. 1B with rotated aspect ratios.
Figure 3A:
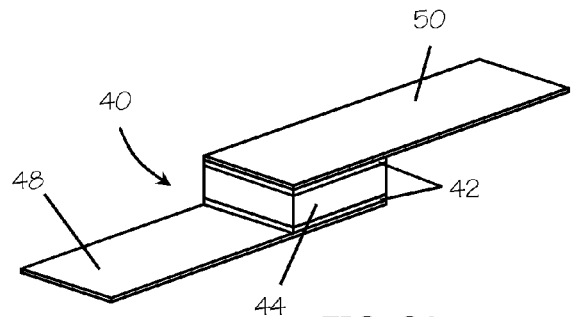
FIG. 3A illustrates a known configuration for a beam lead capacitor.
Figure 3B:
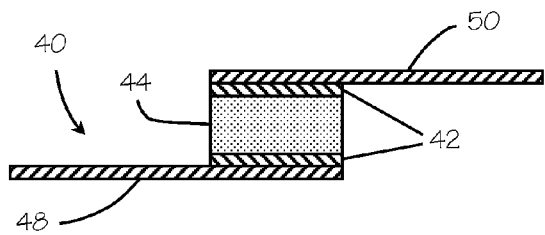
FIG. 3B illustrates a cross-section of the beam lead capacitor of FIG. 3A.
Figure 3C:
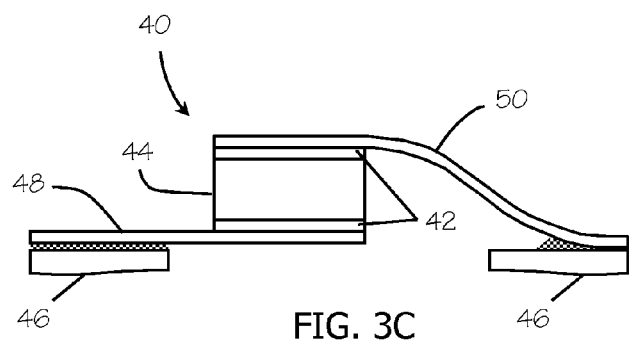
FIG. 3C illustrates an exemplary mounting of the beam lead capacitor of FIG. 3A.
Figure 3D:
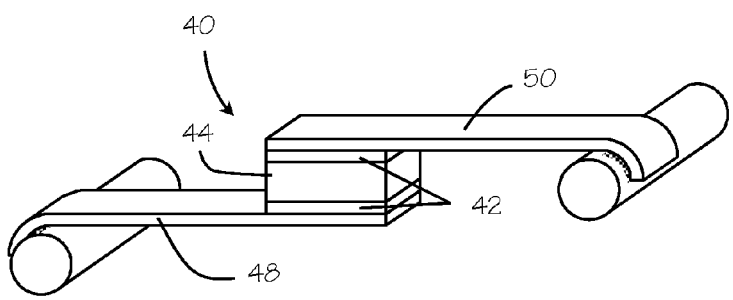
FIG. 3D illustrates an alternate exemplary mounting of the beam lead capacitor of FIG. 3A.

The relative size of the solder areas 72 at the bottom lead frame 64 and flange portions 80, 82 of the top lead frame 66 may be considerably larger than those of the traditional lead frame 26 contacts of a stacked configuration 20 known in the prior art and seen in FIG. 2A. Even more importantly, the end terminations 70a-70d, 71a-71d in the embodiment shown in FIGS. 4 and 5 are directly in contact with the circuit board through a single base plate of conductive material making up the bottom lead frame 64. This increased contact area directly in contact with the board 30 may allow for better heat transfer characteristics between the stacked multilayer capacitor 60 and the circuit board 30. Typically, the circuit board 30 in a power supply may contain a thick ground plane that may give high conductivity both electrically and thermally. The top lead frame 66 may also assist in transferring heat away from the top of the capacitors 68a-68d. Having conductive material connecting from the top of the capacitors 68a-68d down to the circuit board 30 on both sides of the capacitors 68a-68d, as seen in FIG. 4, provides heat dissipation from the top of the stacked capacitor 60 that is at least as good as a traditional stack capacitor 20 (FIG. 1). However, due to the increased conductive material making up the top lead frame 66, this configuration may be better at dissipating heat energy.

The top lead frame 66 may also function to hold down the stacked multilayer capacitor 60 overcoming problems due to vibration from mechanical shock. For existing stack capacitors 20, as seen in the prior art in FIG. 2A, the mass of the stack is substantial with its center of gravity well above the board, creating a concern that the capacitor may break loose during operation. Previous solutions included using an epoxy to better adhere the stacks to the board. Epoxies may be problematic, however, because many epoxy-based materials have a high co-efficient for thermal expansion. If the epoxy is placed under the stack in a manner that would best hold it down to the circuit board, the epoxy may expand upon normal heating and push the stack off the board, like a jack under a car. Another method applies the epoxy on the side so that it touches the stacked capacitor, but does not flow under. In this case, the co-efficient of thermal expansion may still cause problems, and it is doubtful that the strength of the epoxy on the side will be sufficient to hold the capacitor down.

In the embodiment shown in FIG. 4 the top lead frame 66 not only provides an electrical connection, but also may hold down the capacitor mechanically. The top lead frame 66 may be soldered 72 to the circuit board 30, soldering both flanges 80, 82. In another exemplary embodiment shown in FIG. 5, a hole 88 may be placed on the flange portions 80, 82 of the top lead frame 66 to allow for a fastener (not shown), such as a screw, a rivet, or other comparable fastener, to be used to mechanically connect the top lead frame 46 to the circuit board 30.

Figure 6:
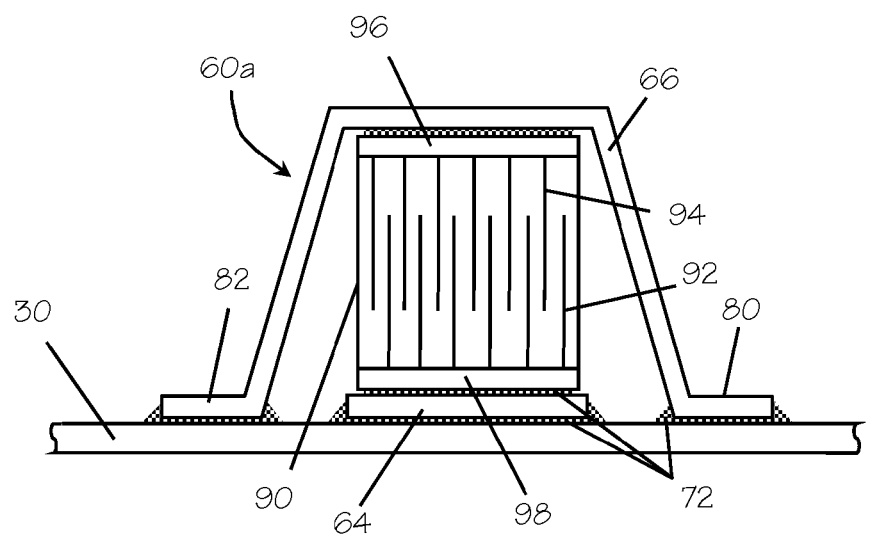
FIG. 6 illustrates a front view of a single multilayer capacitor consistent with an exemplary embodiment of the invention.

In an alternate embodiment of a multilayer capacitor 60a, the split lead frame 62 of the previous embodiment may also be used with a single multilayer capacitor 90. As best seen in FIG. 6, the multilayer capacitors 90 may be positioned such that the interior electrodes 92, 94 are oriented substantially nonparallel with the circuit board 30. Embodiments of the capacitor 60a having a single chip (multilayer capacitor) 90 with interior electrodes 92, 94 oriented substantially normal to the circuit board 30 may provide a smaller footprint on the circuit board 30. Solder areas 72 electrically connect the multilayer capacitor 90 through the end terminations 96, 98 to the top lead frame 66 and the bottom lead frame 64 respectively. The top 66 and bottom 64 lead frames may also be soldered 72 to a circuit board 30 to provide electrical connections between the circuit board 30 and the capacitor 60a. As with the previous embodiment, the top lead frame 66 may also function to hold down the multilayer capacitor 60a overcoming problems due to vibration from mechanical shock. This single chip embodiment differs from the known beam lead capacitor configuration. In contrast to the beam lead capacitor, at least one of the terminals, such as end termination 98 is specifically intended to allow solder beneath the chip or stack. This solder location gives better heat transfer out of the chip and into the circuit board 30 material than contemporary beam lead configurations.

Figure 7:
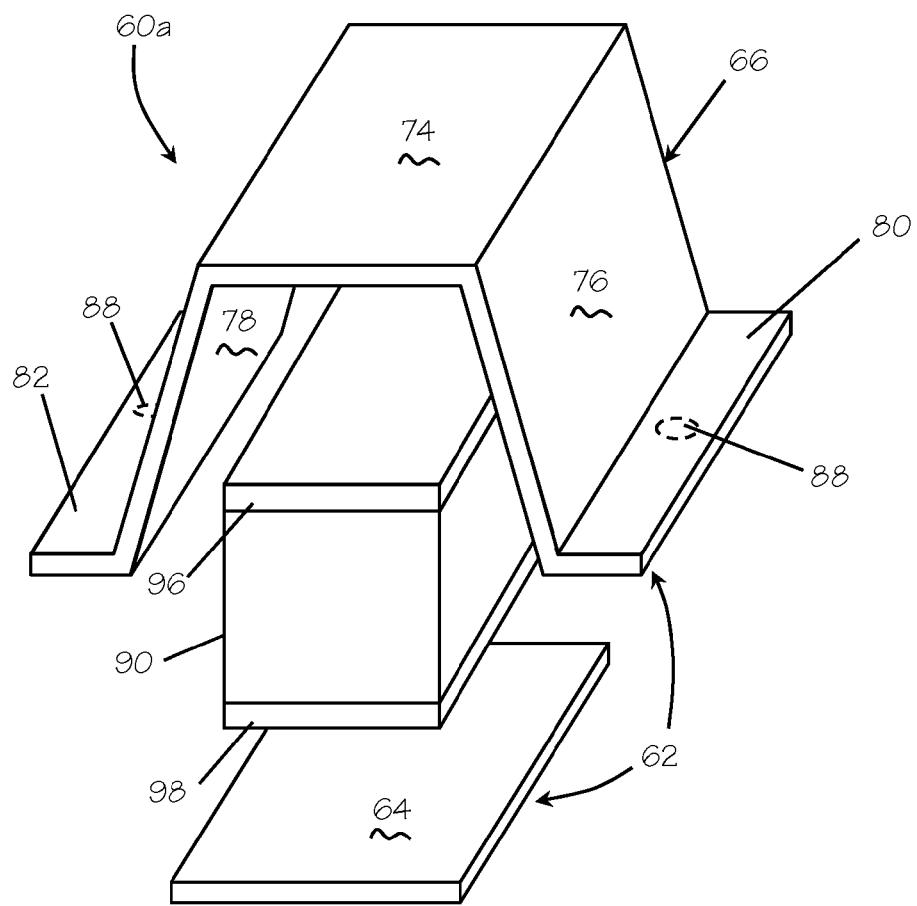
FIG. 7 is an exploded view of the components of the single multilayer capacitor of FIG. 6.
Figure 8:
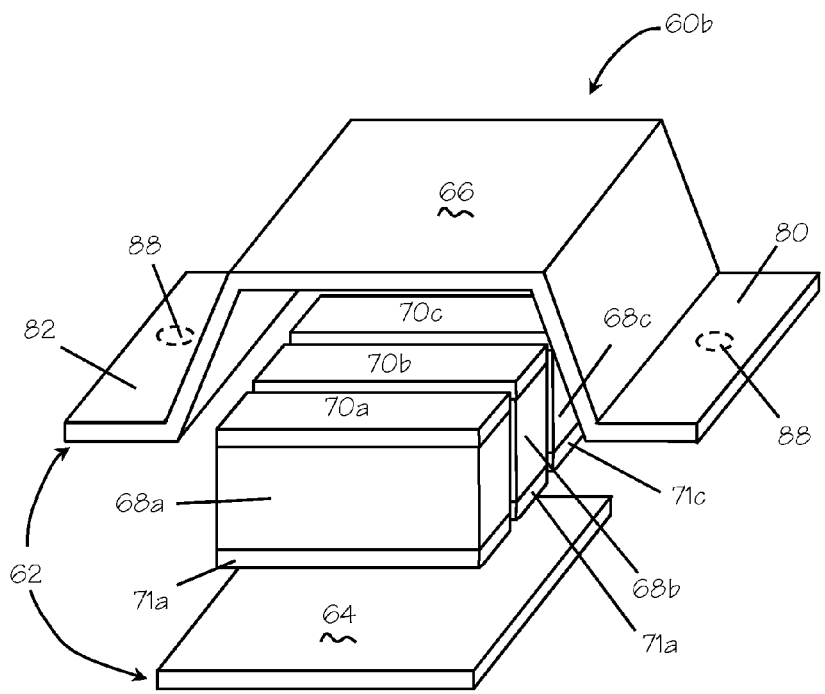
FIG. 8 is an exploded view of an alternate embodiment of the stacked multilayer capacitor shown in FIG. 4.
Figure 9:
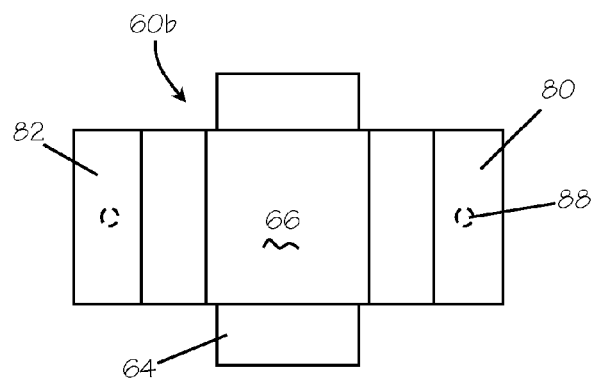
FIG. 9 is a top view of the stacked multilayer capacitor shown in FIG. 4.
Figure 10:
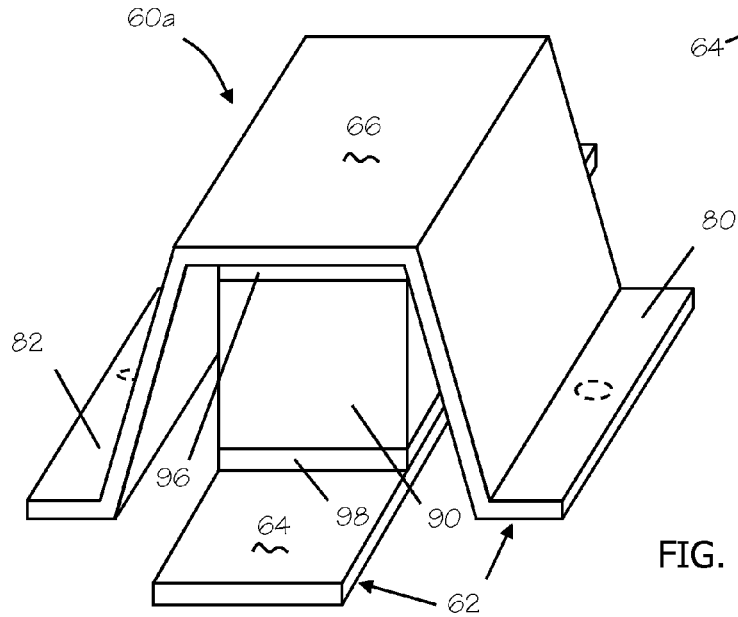
FIG. 10 is a perspective view of the embodiment of FIG. 7.

Optional holes 88 may also be seen in an alternate embodiment of the stacked multilayered capacitor 60b in FIG. 8. In addition to the holes 88 in this particular embodiment, the plurality of capacitors 68a-68c may be oriented such that their lengths are substantially perpendicular to a length of the flanges 80, 82 of the top lead frame 66. Orienting the plurality of capacitors 68a-68c in such a fashion may lead to improved performance. Orienting the capacitors 68a-68d as shown on the stacked capacitor 60 in FIG. 5 may not realize the performance improvements of the stacked capacitor 60b in FIG. 8, but may allow for better inspection after manufacturing operations because it is possible to look between the capacitors 68a-68d in the stacked capacitor 60. FIG. 9 shows a top view of the embodiments in either FIG. 5 or FIG. 8. FIG. 9 is also a top view of the capacitor 60a utilizing a single multilayer capacitor as shown in FIGS. 6, 7, and 10.

Figure 11:
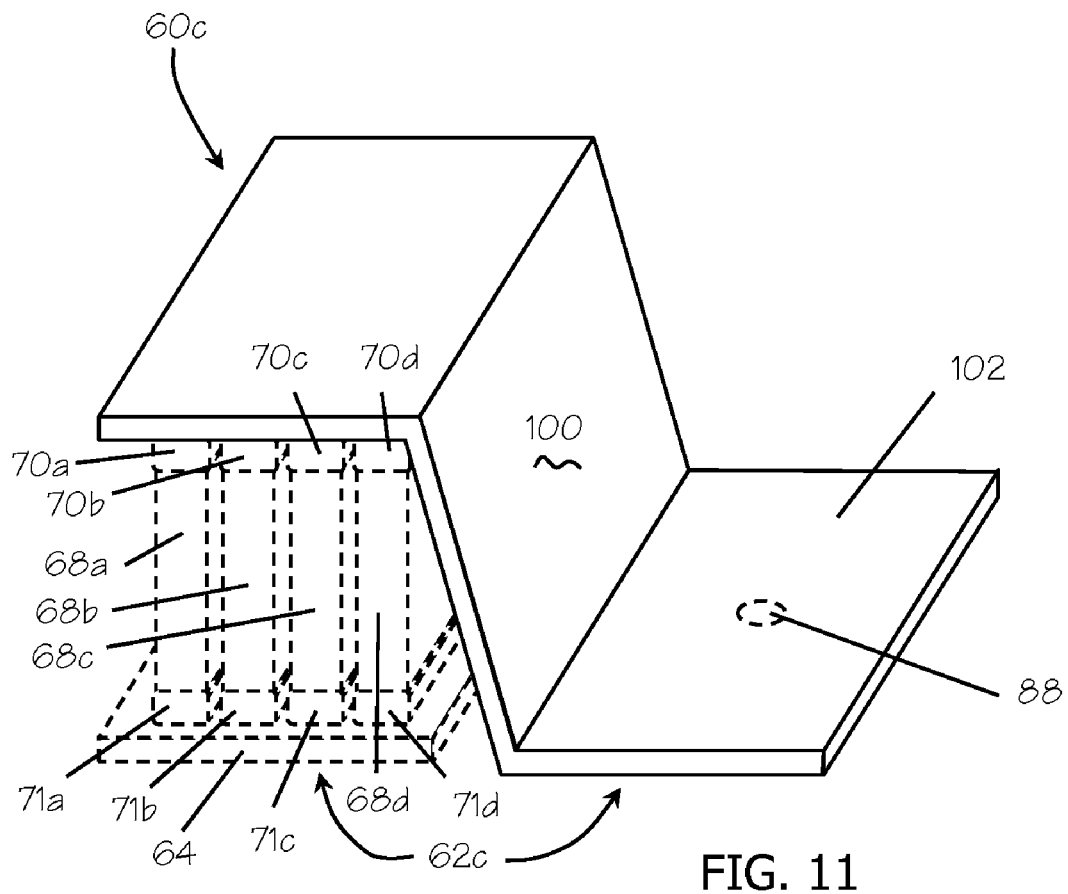
FIG. 11 illustrates a perspective view of a stacked multilayer capacitor consistent with another exemplary embodiment of the invention.
Figure 12:
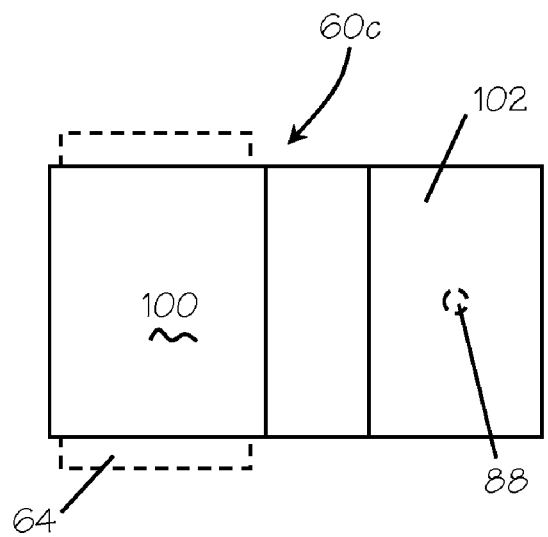
FIG. 12 is a top view of the stacked multilayer capacitor shown in FIG. 11.

In other embodiments of a split lead frame 62c for a stacked multilayer capacitor 60c, the top lead frame may have alternate configurations. For example, in an exemplary embodiment of a split lead frame 62c shown in FIGS. 11 and 12, the top lead frame 100 used in the stacked multilayer capacitor 60c may contain only one flange portion 102. The top lead frame 100 contacts the end terminations 70a-70d of the multilayer capacitors 68a-68d in the same manner as described in previous embodiments, and shown in FIGS. 5 and 8. The top lead frame 100 may also have an optional hole 88 as previously discussed above. An advantage of using an embodiment such as the stacked capacitor 60 in FIGS. 11 and 12 would be a smaller footprint on the circuit board 30 which is provided by the top lead frame 100 having only one flange portion 102. The split lead frame 62c consisting of top lead frame 100 and bottom lead frame 64 may be soldered to the circuit board as discussed above, or the top lead frame 100 may also be mechanically connected to the circuit board 30 by a fastener through the optional hole 88 as discussed above. The orientation of the capacitors 68a-68d in the stacked configuration 60c may also be oriented parallel to or normal to a length of the flange portion 102 of the top lead frame 100.

Figure 13:
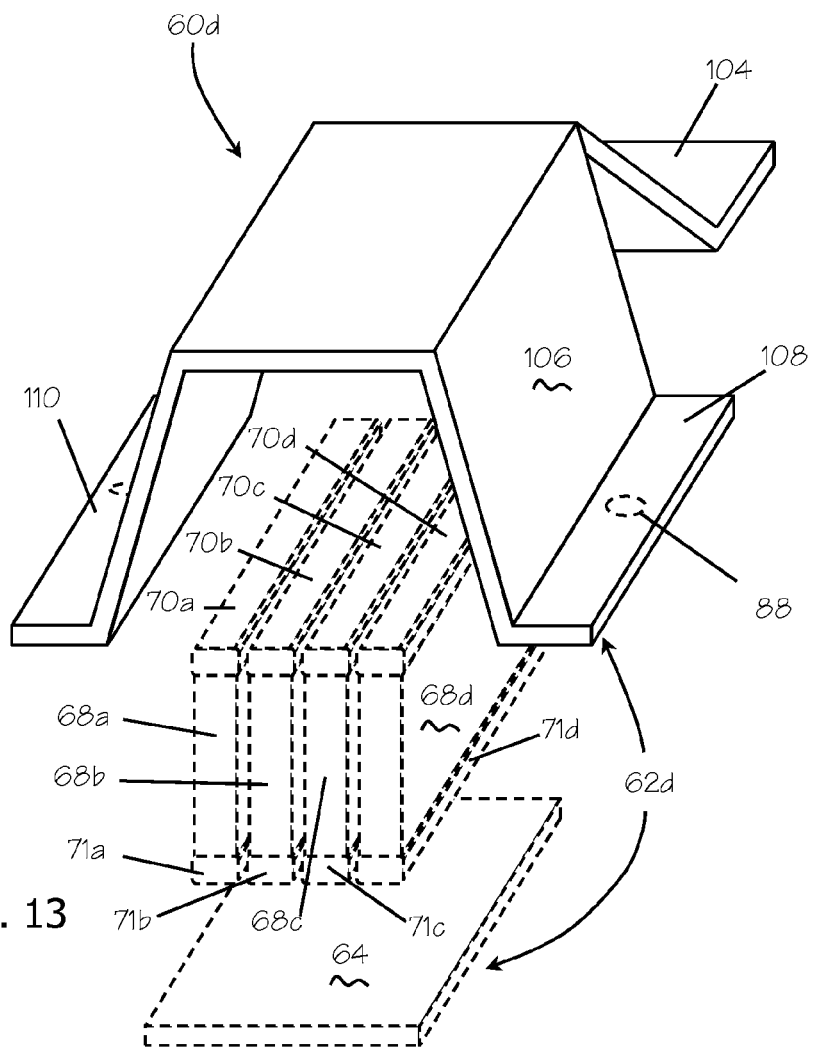
FIG. 13 illustrates an exploded, perspective view of a stacked multilayer capacitor consistent with another exemplary embodiment of the invention.
Figure 14:
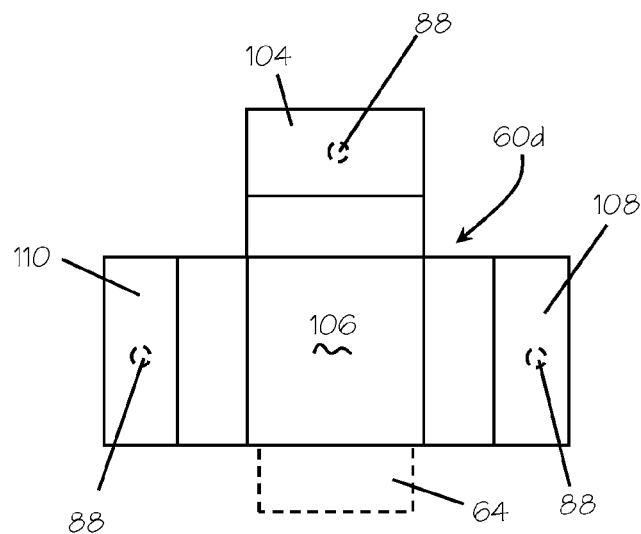
FIG. 14 is a top view of the stacked multilayer capacitor shown in FIG. 13.

As shown in FIGS. 13 and 14, and in still another embodiment, a split lead frame 62d for a stacked multilayer capacitor 60d has a third flange portion 104 extending from the top lead frame 106. The third flange portion 94 may increase thermal dissipation of the capacitor 60d as well as provide additional electrical and mechanical connections. In the stacked multilayer capacitor configuration 60d, the three flange portions 104, 108, 110 may be soldered to a circuit board, or may contain optional holes 88 through which the top lead frame 106 may be fastened to the circuit board. Similar to the other embodiments, the orientation of the multilayer capacitors 68a-68d may be substantially parallel to, or substantially normal to, the open end of the top lead frame 106. End terminations 70a-70d, 71a-71d may be connected directly to the respective top and bottom lead frames 106, 64 by the use of solder. Because this particular embodiment has three flange portions 104, 108, 110, a combination of fasteners and solder inside may be utilized to electrically or mechanically connect this particular embodiment to a circuit board in a manner similar to that described with respect to FIG. 8.

Figure 15A:
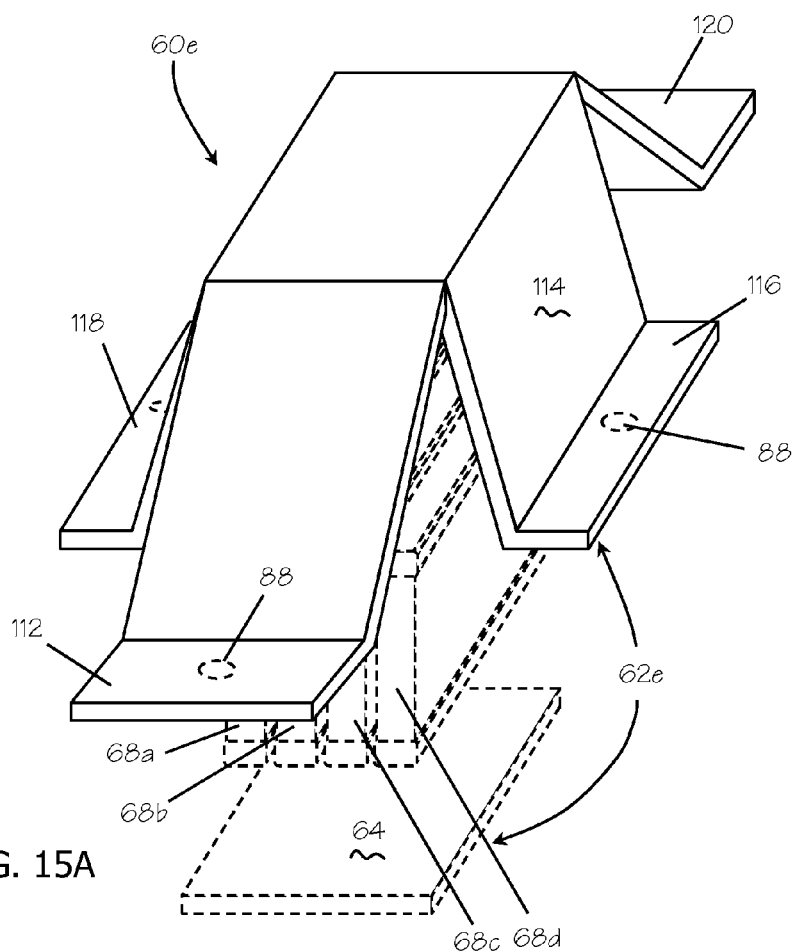
FIG. 15A illustrates an exploded, perspective view of a stacked multilayer capacitor consistent with another exemplary embodiment of the invention.
Figure 15B:
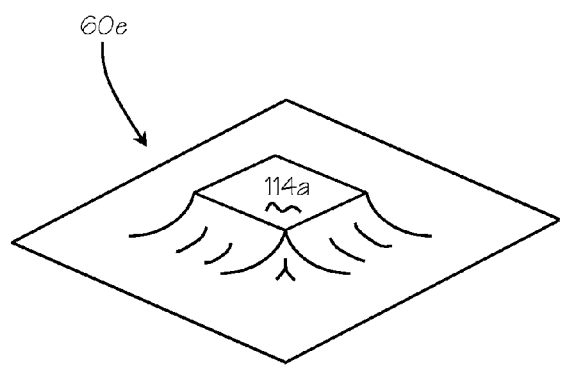
FIG. 15B is an alternate configuration of the stacked multilayer capacitor of FIG. 15A.
Figure 16A:
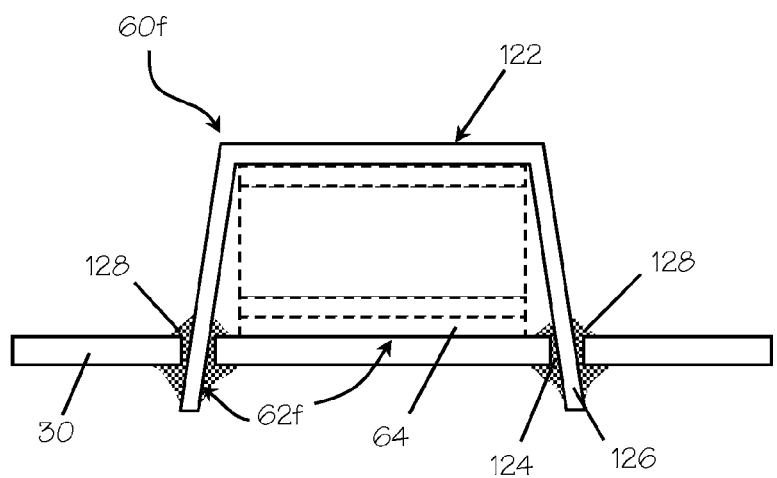
FIG. 16A illustrates an alternate exemplary embodiment of the stacked multi-layer capacitor shown in FIG. 8.
Figures 16B, 16C:
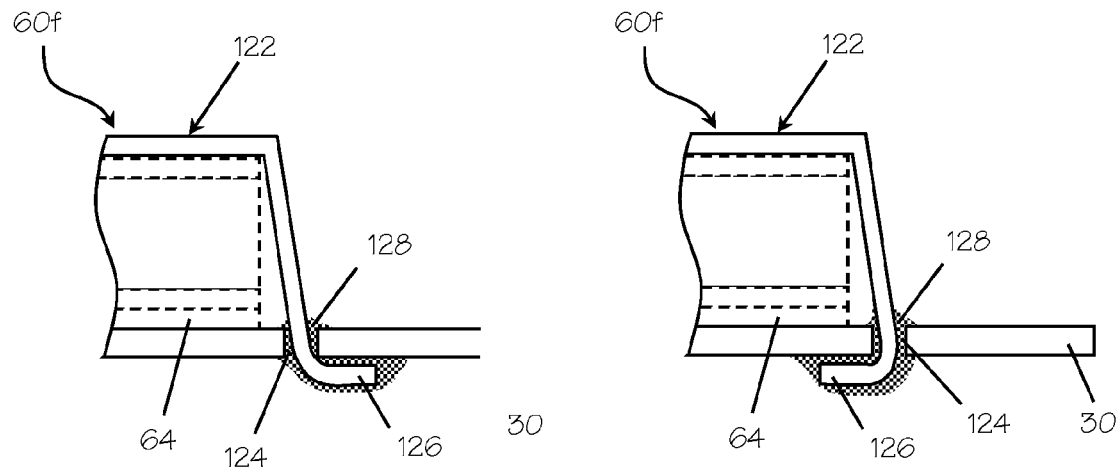
FIGS. 16B-16D illustrate alternate mounting configurations of the stacked multilayer capacitor of FIG. 16A.
Figure 16D:
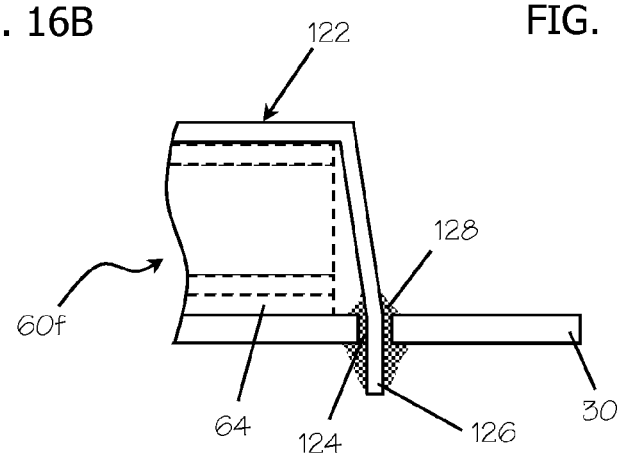

Another exemplary embodiment of the split lead frame 62e is shown in the stacked multilayer capacitor 60e of FIG. 15A. In this embodiment, a fourth flange portion 112 extends from the top lead frame 114. Similar to the embodiment above and shown in FIGS. 13 and 14, the additional flange portion 112 may increase thermal dissipation of the capacitor as well as provide additional electrical and mechanical connections. All four flange portions 112, 116, 118, 120 may be soldered to a circuit board or may contain optional holes 88 through which the top lead frame 114 may be fastened to the circuit board. Alternately top lead frame 114a in this embodiment may be drawn as a single piece as shown in FIG. 15B, rather than the cut and bent configuration shown in FIG. 15A. With this configuration, the corners of the chips would not be exposed, which may make inspection difficult, but may be useful for shielding. An advantage of either configuration in FIGS. 15A and 15B provides for shielding. Shielding may become important for higher operating frequencies, such as in the range of about 13 MHz and above.

In another exemplary embodiment, a split lead frame 60f shown in FIGS. 16A through 16D has an alternate embodiment of the top lead frame 122. In this embodiment, the top lead frame 122 connects to the circuit board 30 and potentially buried traces (not shown) with a through hole 124 connection. The top lead frame 126 may be a ribbon type configuration where the ends 126 of the ribbon extend through the holes 124 in the circuit board 30. The ends 126 of the top lead frame 122 may then be soldered directly or bent and soldered to the circuit board as shown in the different attachment configurations in FIGS. 16A-16D.

Figure 17A:
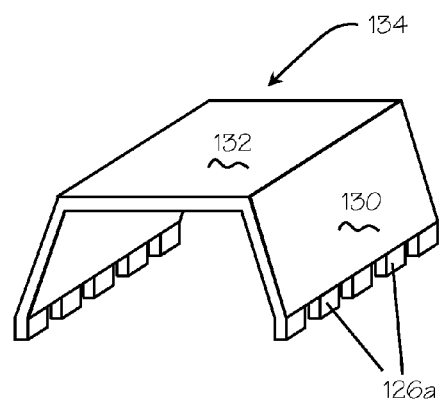
FIG. 17A is a perspective view of a configuration of the top lead frame shown in FIGS. 16A-16D.
Figure 17B:
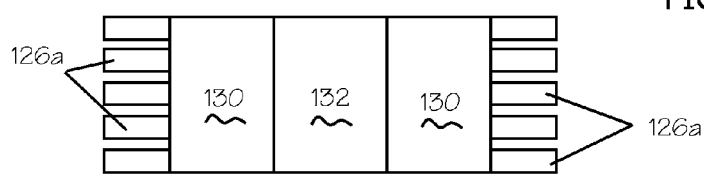
FIG. 17B is a top, flattened view of the top lead frame shown in FIG. 17A.
Figure 17C:
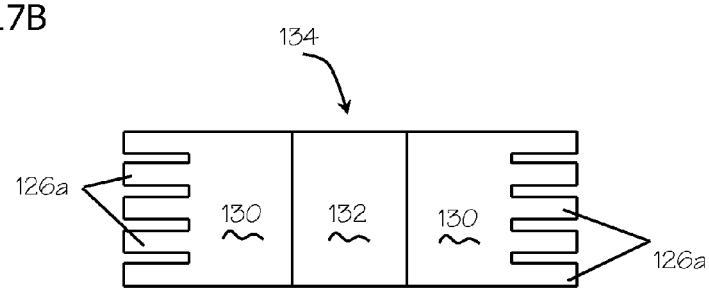
FIG. 17C is an alternate top, flattened view of the top lead frame shown in FIG. 17A.

Alternately, the ends 126 may be finger type connectors 126a as shown in FIGS. 17A, 17B and 17C. The fingers 126a are connected to a transition portion 130, which electrically connects the fingers 126a to the end terminations 70a-70d of the multilayer capacitors 68a-68d through the top plate 132 of the top lead frame 134. The fingers 110a may be inserted and soldered in holes 112 in the circuit board 30. As with the ribbon type configuration in the top lead frame 126 above, the fingers may be soldered directly or bent and soldered as shown in the FIGS. 13A-13D above.

These embodiments of the top lead frame 126, 136 may have an advantage over the previous embodiments as the additional area devoted to connecting the top lead frames 122, 134 to the circuit board 30 is negligible when compared to connecting the flange portions 80, 82 of the top lead frame 66 (FIG. 4) to solder pads on the circuit board 30 for the embodiments discussed above. Thus, these embodiments have a smaller overall footprint when compared with further examples of the split lead frames 62, 62a, 62b, 62c, 62d, 62e of the embodiments discussed above, which utilize connecting flanges.

Figure 18:
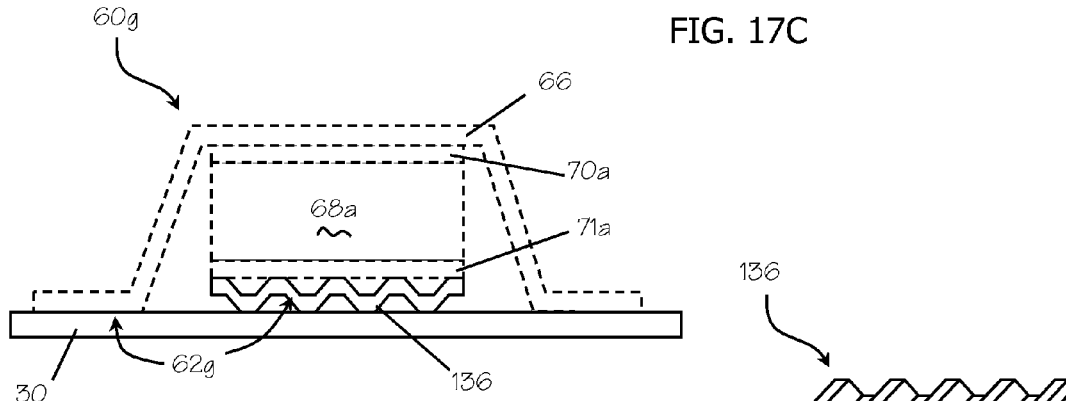
FIG. 18 illustrates an alternate exemplary embodiment of a bottom lead frame of the stacked multi-layer capacitor shown in FIG. 8.
Figure 19:
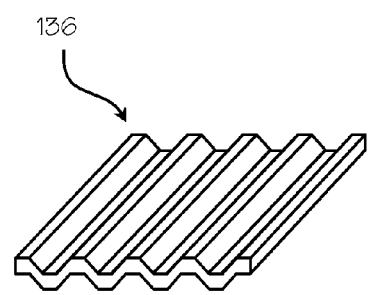
FIG. 19 is a perspective view of the bottom lead frame shown in FIG. 18.

FIGS. 18 and 19 illustrate a stacked multi-layer capacitor 60g with a split lead frame 62g having an alternate embodiment of the bottom lead frame 136. In this embodiment, the bottom lead frame 136 may have a corrugated shape designed to provide compliance between the multi-layer capacitor 68a-68d and the circuit board 30. The compliance may be useful in overcoming issues with thermal stress as the coefficient of thermal expansion of the multilayer capacitor 68a-68d and the circuit board 30 may be different. As with the previous embodiments, the bottom lead frame 136 electrically connects to the circuit board 30 and an end termination 71a-71d of the capacitors 68a-68d. The top lead frame 66 provides electrical connections to the opposing end terminations 70a-70d and electrically connects to the circuit board 30 in a manner similar to that described with respect to FIG. 8. Any of the alternate embodiments of the top lead frame 100, 106, 114, 114a, 122, 134 discussed above may be used with the corrugated bottom lead frame 136 shown in FIG. 19.

Figure 20:
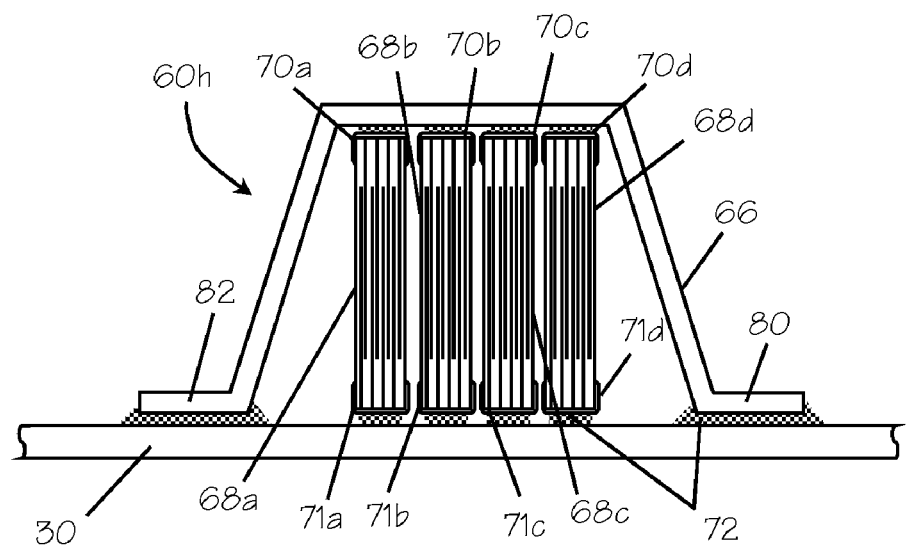
FIG. 20 illustrates an alternate exemplary embodiment of the stacked multilayer capacitor shown in FIG. 4 without the bottom lead frame.
Figure 21:
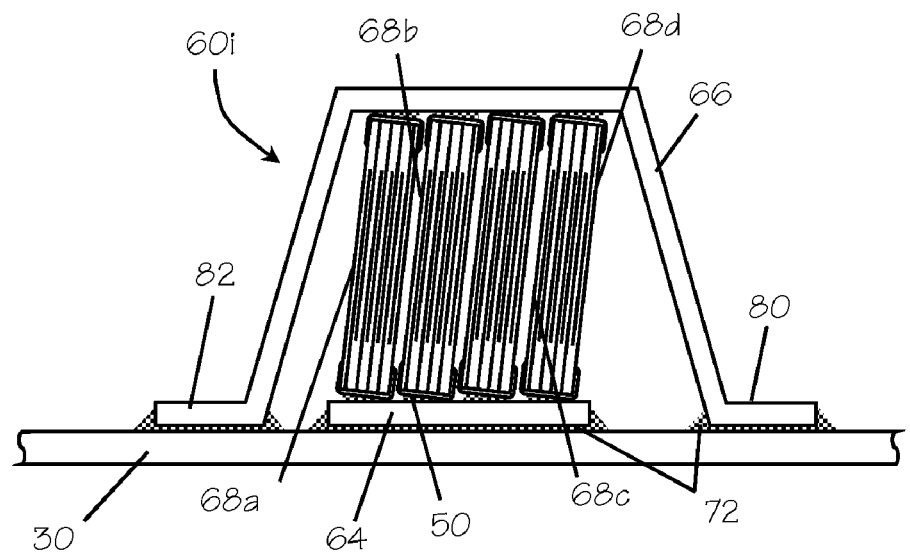
FIG. 21 illustrates a front view of an alternate embodiment of the capacitors of the stacked multilayer capacitor in FIG. 4.

In some embodiments and as best seen in FIG. 20, the bottom lead frame may be omitted and the individual capacitors 68a, 68b, 68c, and 68d may be electrically connected directly to the circuit board 30. End terminations 70a-70d may be attached to the top lead frame 66 as discussed above. The opposite end terminations 71a-71d may be connected directly to a conductive pad on the circuit board by solder, conductive paste, conductive epoxy, or some other attachment.

Figure 22:
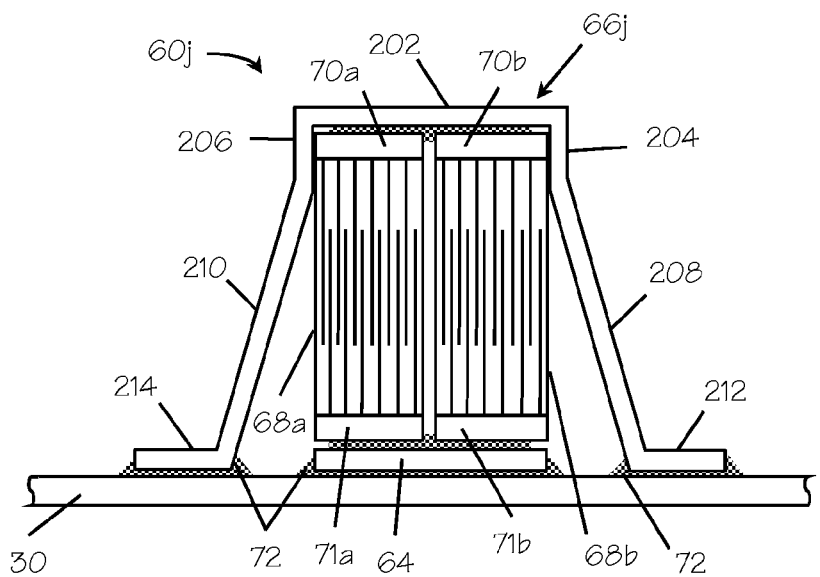
FIG. 22 illustrates a front view of a stacked multilayer capacitor with another alternate exemplary embodiment of the top lead frame.
Figure 23:
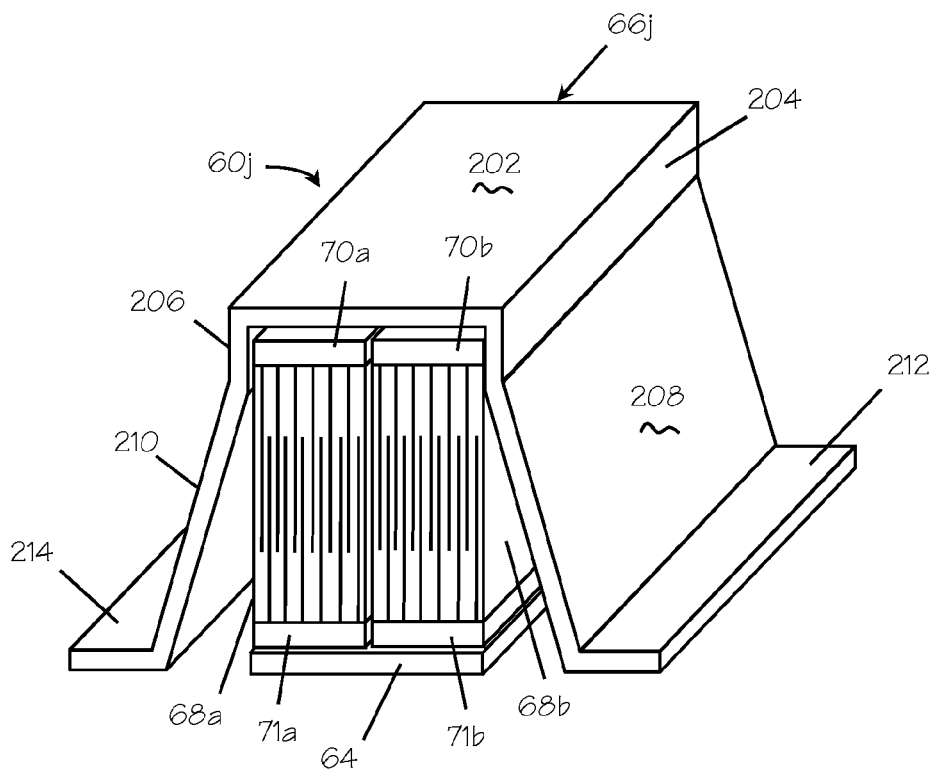
FIG. 23 is a perspective view of the stacked multilayer capacitor of FIG. 22.

In an alternate embodiment of a stacked multilayer capacitor 60j illustrated in FIGS. 22 and 23, the top lead frame 66j may be crimped such that a portion of the top lead frame contacts a portion of a side of the capacitors 68a, 68b proximate to the portions of the top lead frame. Similar to the embodiment in FIGS. 4 and 5, the stacked multilayer capacitor 60j is composed of a split lead frame having a bottom lead frame 64 containing a bottom plate and a top lead frame 66j. The lead frame electrically connects one or more multilayer capacitors 68a, 68b having respective conductive end terminations 70a, 70b and 71a, 71b. As discussed above, the aspect ratios of the multilayer capacitors may be rotated to achieve a lower inductance in each of the multilayer capacitors 68a, 68b in the stack. For embodiments of the capacitor where vibration rather than inductance or heat reduction is the design variable, then the length of the capacitors from termination to termination may be equal to the width of the capacitor, or the length from termination to termination may be longer than the width of the capacitor.

By orienting the multilayer capacitors substantially in the vertical direction, and making the capacitors short in vertical height, the stack is of inherently low inductance and presents a lower profile against the circuit board. The top plate 202 of the top lead frame 66j is designed to electrically contact the terminations 70a, 70b on the ends of the multilayered capacitors 68a, 68b opposite the bottom lead frame 64. The opposed edges of the top plate 202 connect to the crimped portions 204, 206, which in turn connect to transition portions 208, 210, which extend down toward the circuit board 30 and connect to respective flange portions 212, 214 of the top lead frame 66j.

Solder areas 72 electrically connect the plurality of multilayer capacitors 68a, 68b through the end terminations 70a, 70b, 71a, 71b to the top lead frame 66j and the bottom lead frame 64 respectively. The top 66j and bottom 64 lead frames may also be soldered 72 to a circuit board 30 to provide electrical connections between the circuit board 30 and the stacked capacitor 60j. Solder may also be applied between the crimped portions 204, 206 of the top lead frame 66j and the portions of the sides of the multilayer capacitors. Alternatively the crimped portion 204, 206 may be in slidable contact or in a pressure contact with the portions of the sides of the multilayer capacitors. In yet other embodiments, a small gap may exist between the crimped portions 204, 206 and the portions of the sides of the multilayer capacitors.

Figure 24:
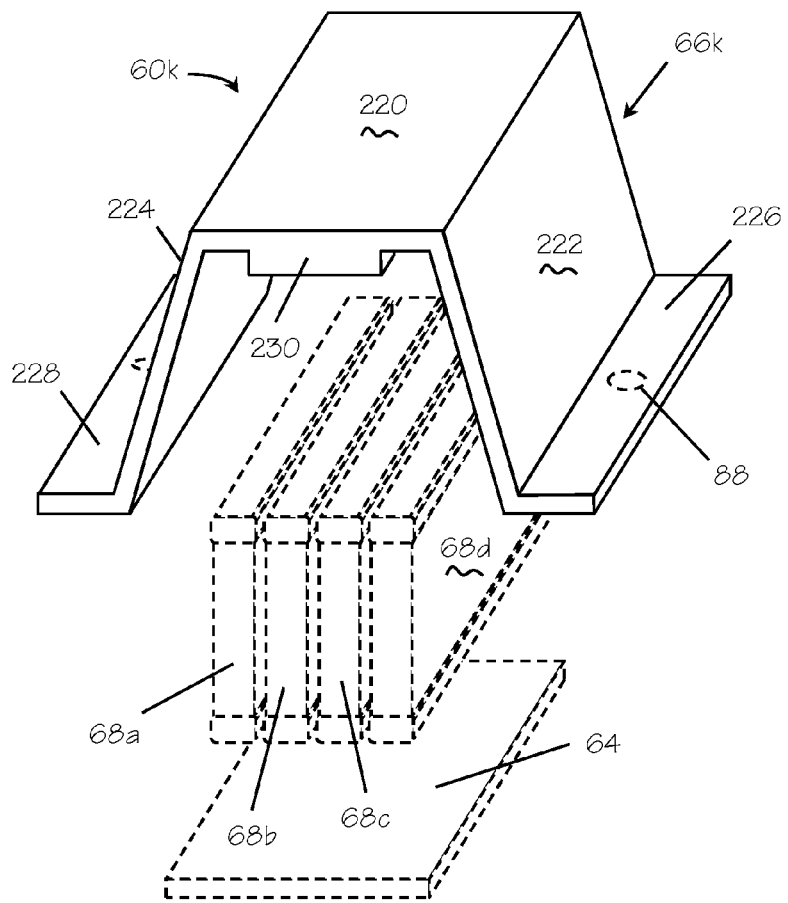
FIG. 24 illustrates an exploded view of an alternate configuration of the top lead frame in FIG. 5.

Alternatively, the top lead frame 66k in the embodiment illustrated in FIG. 24 contacts a portion of the multiplayer capacitors 68a-68d via a tab member 230 extending from an edge of the top plate 220. The top plate 220 of the top lead frame 66k is designed to electrically contact the terminations 70a, 70b on the ends of the multilayered capacitors 68a, 68b opposite the bottom lead frame 64. The opposed edges proximate the edge containing tab member 230 of the top plate 220 connect to transition portions 222, 224, which extend down toward the circuit board (not shown) and connect to respective flange portions 226, 228 of the top lead frame 66k. Optional holes 88 may be placed on the flange portions 226, 228 of the top lead frame 66k to allow for a fastener (not shown), such as a screw, a rivet, or other comparable fastener, to be used to mechanically connect the top lead frame 66k to the circuit board.

Figure 25:
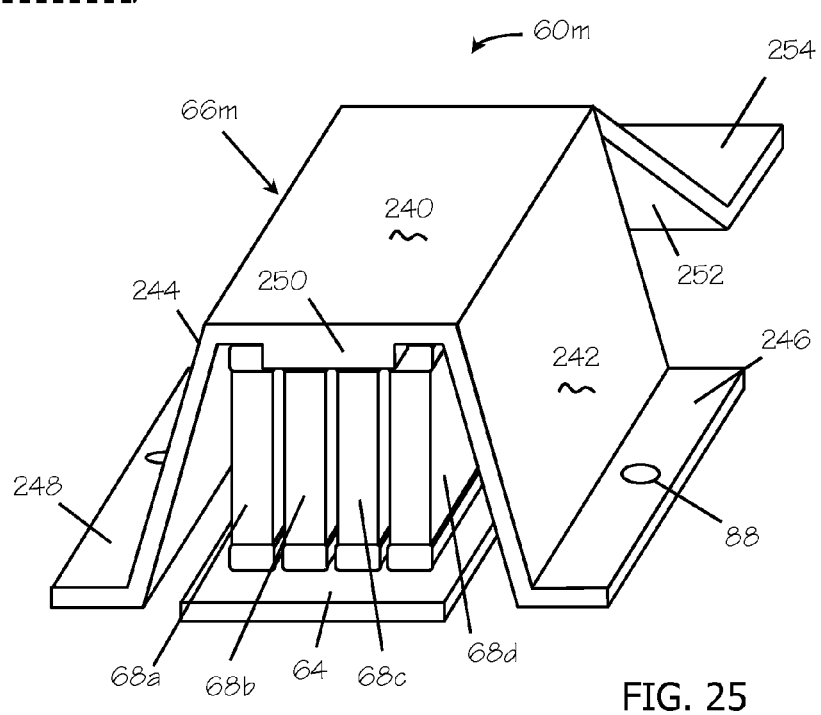
FIG. 25 illustrates an alternate configuration of the top lead frame of FIG. 13.

Similar to the stacked multilayer capacitor 60k in FIG. 24, FIG. 25 illustrates a top lead frame 66m with a tab member 250 similarly located on an edge of top plate 240 as well as opposed edges proximate the edge containing tab member 250 of the top plate 240 connect to transition portions 242, 244, which extend down toward the circuit board (not shown) and connect to respective flange portions 246, 248 of the top lead frame 66m. Additionally a third flange portion 254 via transition portion 252 extends from the top plate 240. The third flange portion 254 may increase thermal dissipation of the stacked multilayer capacitor 60m as well as provide additional electrical and mechanical connections. In the stacked multilayer capacitor configuration 60m, the three flange portions 246, 248, 254 may be soldered to a circuit board, or may contain optional holes 88 through which the top lead frame 66m may be fastened to the circuit board similar to the configuration illustrated in FIG. 13. Optional holes 88 may be placed on any of the flange portions 246, 248, 254 of the top lead frame 66k similar to above.

Figure 26:
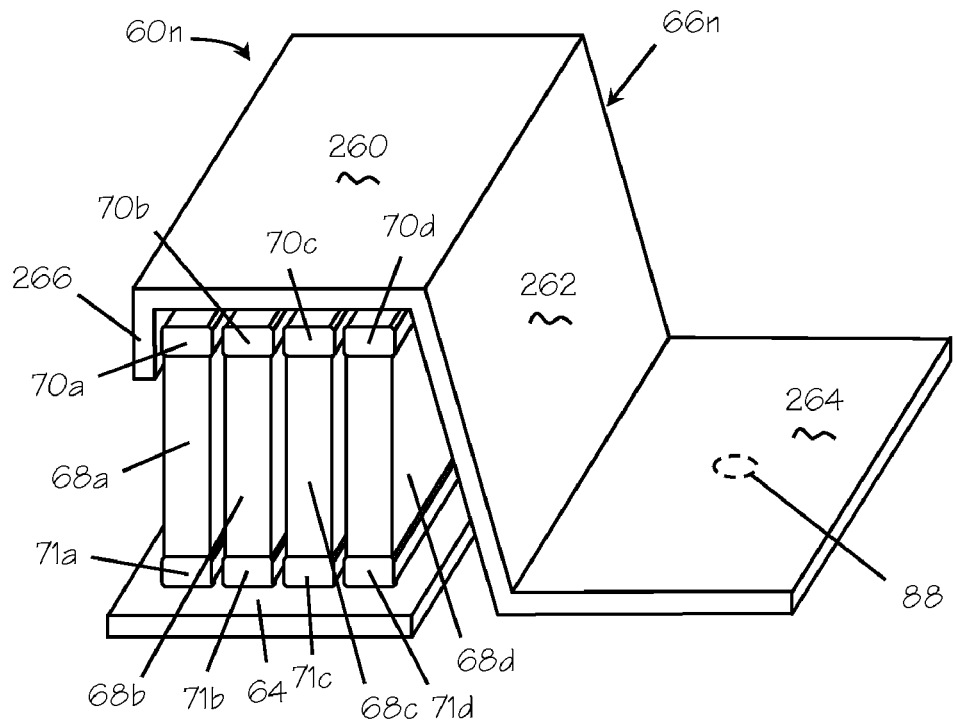
FIG. 26 illustrates an alternate configuration of the top lead frame of FIG. 11.
Figure 27:
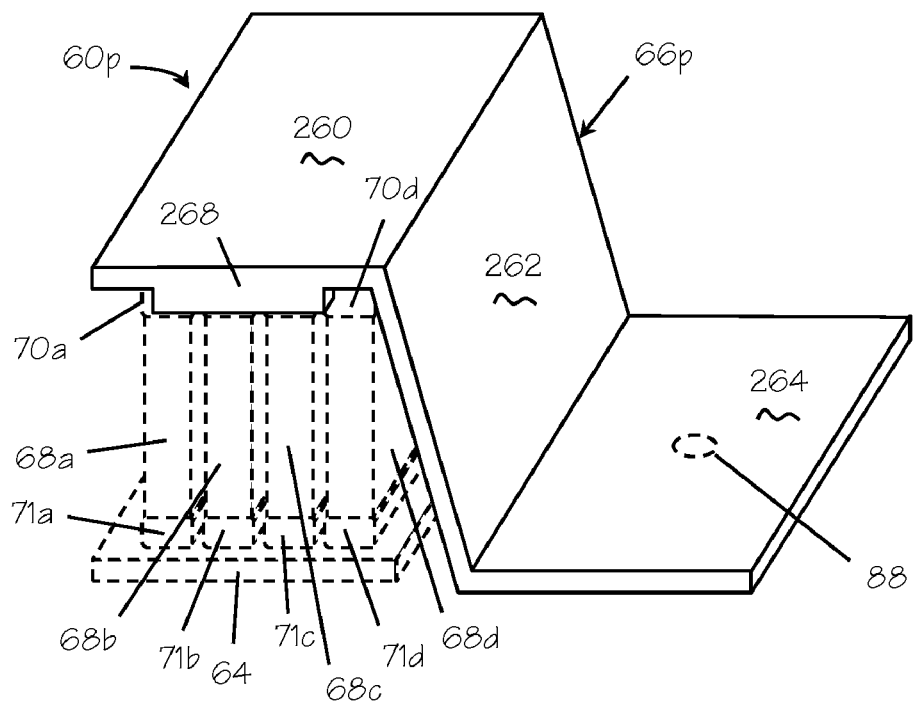
FIG. 27 illustrates another alternate configuration of the top lead frame of FIG. 11.

In another embodiment of a split lead frame shown in FIGS. 26 and 27, the top lead frame 66n, 66p used in the stacked multilayer capacitor 60n, 60p may contain only one flange portion 264. The top lead frame 66n, 66p contacts the end terminations 70a-70d of the multilayer capacitors 68a-68d in the same manner as described in previous embodiments, and shown in FIGS. 5 and 8. The top lead frame 66n, 66p may also have an optional hole 88 as previously discussed above. An advantage of using an embodiment such as the stacked capacitor 60n and 66p in FIGS. 26 and 27, as well as FIGS. 11 and 12, would be a smaller footprint on the circuit board 30 which is provided by the top lead frame 66n, 66p having only one flange portion 264.

The embodiment of the top split lead from 66n in FIG. 26 also contains a tab member 266 extending from an edge of the top plate 260 opposite from the transition portion 262 connecting the top plate 260 to the flange portion 264. Similar to the embodiments in FIGS. 24 and 25, a portion of the tab member 266 contacts a portion of a side of a multilayer capacitor 68a of the plurality of multilayer capacitors 68a-68d. The tab portion 266 may be incorporated for additional stability and containment of the plurality of multilayer capacitors 68a-68d since the configuration only contains one transition and flange portion.

The embodiment of the top split lead from 66p in FIG. 27 similarly contains a tab member 268 extending from an edge of the top plate 260 adjacent to the transition portion 262 connecting the top plate 260 to the flange portion 264. A portion of this tab member 268 also contacts a portion of a side of a multilayer capacitor 68a in the plurality of multilayer capacitors 68a-68d. The tab portion 266 may be incorporated for additional stability and containment of the plurality of multilayer capacitors 68a-68d since the configuration only contains one transition and flange portion. In some embodiments, an additional tab member may be included extending from the other edge adjacent to the transition portion and opposite from the first tab member 268.

In any of the embodiments including the tab members 230, 250, 266, and 268, the tab members may slidably contact the portion of the multilayer capacitors. The tab members 230, 250, 266, and 268 may be in a tight contact from a pressure fit with the portion of the multilayer capacitors. The tab members 230, 250, 266, and 268 may also be soldered to the portion of the multilayer capacitors. It is also contemplated that there may be a small gap between the tab members 230, 250, 266, and 268 and the portion of the multilayer capacitors.

Figure 28:
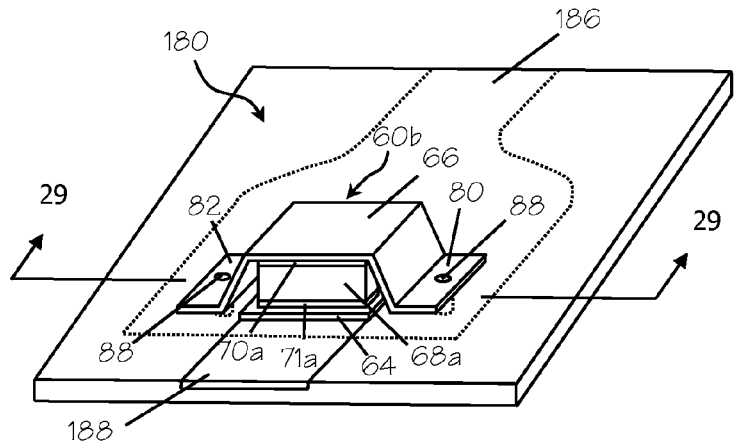
FIG. 28 is a perspective view of the stacked multilayer capacitor of FIG. 8 mounted on a circuit board.
Figure 29:
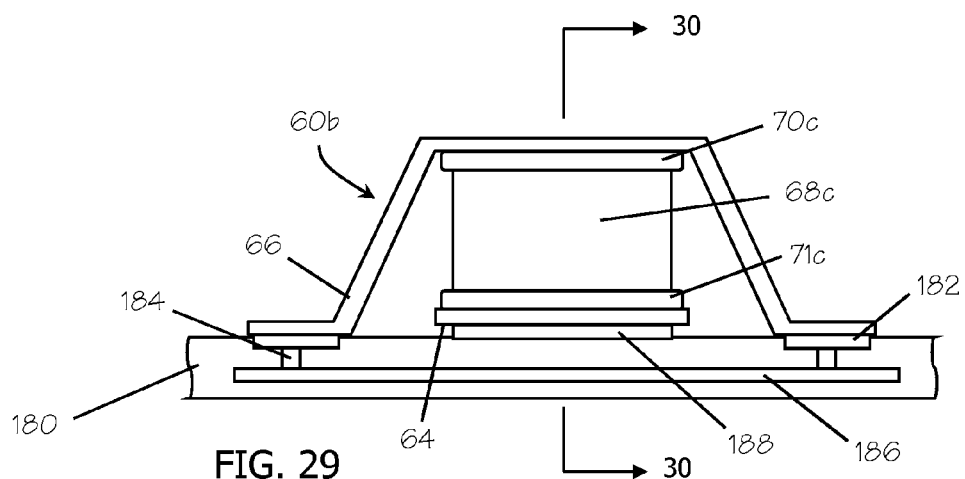
FIG. 29 is a cross section of the stacked multilayer capacitor shown in FIG. 28 generally along line 29-29.
Figure 30:
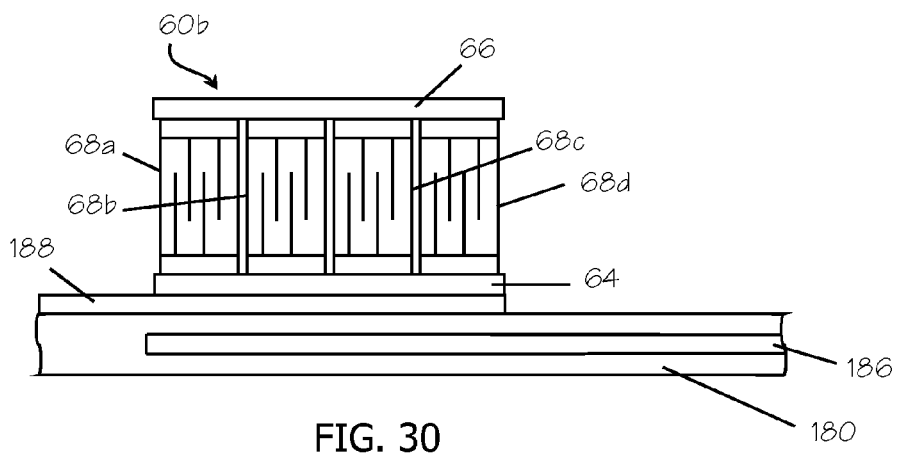
FIG. 30 is a cross section of the stacked multilayer capacitor shown in FIG. 29 generally along line 30-30.

Referring now to FIGS. 28 through 30, an embodiment of the stacked multilayer capacitor 60b (FIG. 8) may be mounted to a printed circuit board 180. The top lead frame 66 may contact and be soldered to one or more solder pads 182 which are electrically connected through respective vias 184 to a buried trace 186. The bottom lead frame 64 may be soldered directly to a surface trace 188. In this particular example, one conducting trace 188 is on top of the board 180; and the other conducting trace 186 is inside of the board 180. Connecting the top lead frame 66 to the solder pads 182 that are connected through vias 184 to the buried trace 186 may provide an advantage of a lower inductance than with other possible board layouts.

Though the stacked multilayer capacitors 60-60m have been illustrated utilizing different split lead frames 62-62m and a plurality of chips or multilayer capacitors 68a-68d, the single chip 90 (FIG. 6) configuration may also be used with any of the split lead frames 62-62m. The single chip embodiment would have the same heat dissipation advantages, lower inductance and mechanical stability of the multi-chip embodiments.

Additionally, with the multiple chip embodiments, the equivalent series resistance of the stack would be generally lower than traditional designs. For example, a traditional design may have two chips of a 0.4"×0.4" cross section, but the equivalent design in an embodiment described above may have four vertical chips juxtaposed having cross section of 0.2"×0.4". The new design has twice as many electroplates which provide the same amount of capacitance (because the plates are half the size, there will be twice as many, hence four chips versus two). Twice as many electrodes give a lower equivalent series resistance, which may help with the performance of the overall stack.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A capacitor device mountable on a plane of a substrate comprising:
    an electrically conductive bottom plate adapted to be mounted substantially parallel to, and in electrical contact at the plane of the substrate;
    a first multilayer capacitor comprising substantially parallel first and second electrode plates oriented substantially perpendicular to the bottom plate with the first electrode plates being electrically connected to the bottom plate; and
    an electrically conductive top lead frame overlapping with, and electrically isolated from, the bottom plate, the top lead frame electrically connected to the second electrode plates and adapted to be electrically connected at the plane of the substrate,
    wherein the bottom plate has a corrugated shape, and wherein the corrugated shape provides compliance between the first multilayer capacitor and the substrate.

2. The capacitor device of claim 1 further comprising:
    a second multilayer capacitor juxtaposed to the first multilayer capacitor,
    the second multilayer capacitor comprising substantially parallel first and second electrode plates oriented substantially perpendicular to the bottom plate with the first electrode plates being electrically connected to the bottom plate and the second electrode plates electrically connected to the top lead frame.

3. The capacitor device of claim 1 wherein the first multilayer capacitor has a first and second dimension, wherein the first dimension is greater than the second dimension, and wherein first and second conductive end terminations electrically connected to the respective first and second electrode plates are oriented along the first dimension.

4. The capacitor device of claim 1 wherein the top lead frame further comprises:
    a top plate spaced apart from the bottom plate;
    a first transition portion having a first end connected to the top plate and a second end, opposite the first end, adapted to be electrically connected to the substrate; and
    a first flange portion, wherein the first flange portion is in electrical connection with the substrate, and
    wherein the first flange portion is electrically connected to the second end of the first transition portion of the top lead frame.

5. A capacitor device mountable on a plane of a substrate comprising:
    an electrically conductive bottom plate adapted to be mounted substantially parallel to, and in electrical contact at the plane of the substrate;
    a first multilayer capacitor comprising substantially parallel first and second electrode plates oriented substantially perpendicular to the bottom plate with the first electrode plates being electrically connected to the bottom plate;
    an electrically conductive top lead frame overlapping with, and electrically isolated from, the bottom plate, the top lead frame electrically connected to the second electrode plates and adapted to be electrically connected at the plane of the substrate;
    a top plate spaced apart from the bottom plate;
    a first transition portion having a first end connected to the top plate and a second end, opposite the first end, adapted to be electrically connected to the substrate;
    a first flange portion, wherein the first flange portion is in electrical connection with the substrate;
    a second transition portion having a first end connected to the top plate and a second end, opposite the first end, adapted to be electrically connected to the substrate; and
    a second flange portion, wherein the second flange portion is in electrical connection with the substrate,and
    a third transition portion,having a first end connected to the plate and a second end, opposite the first end, adapted to be electrically connected to the substrate;
    wherein the first flange portion is electrically connected to the second end of the first transition portion of the top lead frame, and
    wherein the second flange portion is electrically connected to the second end of the second transition portion of the top lead frame.

6. The capacitor device of claim 5 further comprising:
    a third flange portion, wherein the third flange portion is in electrical connection with the substrate, and
    wherein the third flange portion is electrically connected to the second end of the third transition portion of the top lead frame.

7. The capacitor device of claim 6 further comprising:
a fourth transition portion having a first end connected to the top plate and a second end, opposite the first end, adapted to be electrically connected to the substrate.

8. The capacitor device of claim 7 further comprising:
a fourth flange portion, wherein the third flange portion is in electrical connection with the substrate, and
wherein the fourth flange portion is electrically connected to the second end of the fourth transition portion of the top lead frame.

9. A capacitor device mountable on a plane of a substrate comprising: an electrically conductive bottom plate adapted to be mounted substantially parallel to, and in electrical contact at the plane of the substrate; a first multilayer capacitor comprising substantially parallel first and second electrode plates oriented substantially perpendicular to the bottom plate with the first electrode plates being electrically connected to the bottom plate; and an electrically conductive top lead frame overlapping with, and electrically isolated from, the bottom plate, the top lead frame electrically connected to the second electrode plates and adapted to be electrically connected at the plane of the substrate, and a portion of the top lead frame contacting at least a portion of a side of the first multilayer capacitor, wherein the portion of the top lead frame contacting at least the portion of the side of the first multilayer capacitor comprises: a tab extending from an edge of the top plate opposite the first transition portion and contacting a portion of a side of the first multilayer capacitor.

10. A capacitor device mountable on a plane of a substrate comprising: an electrically conductive bottom plate adapted to be mounted substantially parallel to, and in electrical contact at the plane of the substrate; a first multilayer capacitor comprising substantially parallel first and second electrode plates oriented substantially perpendicular to the bottom plate with the first electrode plates being electrically connected to the bottom plate; and an electrically conductive top lead frame overlapping with, and electrically isolated from, the bottom plate, the top lead frame electrically connected to the second electrode plates and adapted to be electrically connected at the plane of the substrate, and a portion of the top lead frame contacting at least a portion of a side of the first multilayer capacitor, where the top lead frame further comprises:
a top plate spaces apart from the bottom plate;
a first transition portion having a first end connected to the plate and a second end, opposite the first end, adapted to be electrically connected to the substrate.

11. The capacitor of claim 10, further comprising:
a first flange portion, wherein the first flange portion is in electrical connection with the substrate, and
wherein the first flange portion is electrically connected to the second end of the first transition portion of the top lead frame.

12. The capacitor device of claim 10, wherein the portion of the top lead frame contacting at least a portion of the side of the first multilayer capacitor comprises:
a crimped portion between the top plate and the first transition portion, the crimped portion electrically connected the top plate and the first transition portion and contacting the first multilayer capacitor.

13. The capacitor of claim 10, further comprising:
a second transition portion having a first end connected to the top plate and a second end, opposite the first end, adapted to be electrically connected to the substrate.

14. The capacitor of claim 13, further comprising:
a second flange portion, where the second flange portion is in electrical connection with the substrate, and
wherein the second flange portion is electrically connected to the second end of the second transition portion.

15. The capacitor of claim 13, further comprising:
a third transition portion having a first end connected to the top plate and a second end, opposite the first end, adapted to be electrically connected to the substrate.

16. The capacitor of claim 15, further comprising:
a third flange portion, wherein the third flange portion is in electrical connection with the substrate, and
wherein the third flange portion is electrically connected to the second end of the third transition portion of the top lead frame.

17. The capacitor of claim 10, wherein, wherein the portion of the top lead frame contacting at least the portion of the side of the first multilayer capacitor comprises:
a tab extending from an edge of the top plate adjacent to the first transition portion and contacting a portion of a side of the first multilayer capacitor.

18. The capacitor of claim 10, wherein, wherein the portion of the top lead frame contacting at least the portion of the side of the first multilayer capacitor comprises:
a tab extending from an edge of the top plate opposite the first transition portion and contacting a portion of a side of the first multilayer capacitor.

19. The capacitor of claim 9, further comprising:
a second multilayer capacitor juxtaposed to the first multilayer capacitor,
the second multilayer capacitor comprising substantially parallel first and second electrode plate oriented substantially perpendicular to the bottom plate with the first electrode plates being electrically connected to the bottom plate and the second electrode plates being electrically connected to the top lead frame.

20. The capacitor of claim 19, wherein a portion of the top lead frame contacts at least a portion of a side of the second multilayer capacitor.

21. The capacitor of claim 10, further comprising:
a second multilayer capacitor juxtaposed to the first multilayer capacitor,
the second multilayer capacitor comprising substantially parallel first and second electrode plate oriented substantially perpendicular to the bottom plate with the first electrode plates being electrically connected to the bottom plate and the second electrode plates being electrically connected to the top lead frame.

22. The capacitor of claim 19, wherein a portion of the top lead frame contacts at least a portion of a side of the second multilayer capacitor.

* * * * *